United States Patent
Pizzuti

(10) Patent No.: US 10,281,528 B2
(45) Date of Patent: May 7, 2019

(54) ENHANCED PROTECTION, DIAGNOSIS, AND CONTROL OF POWER DISTRIBUTION AND CONTROL UNITS

(71) Applicant: Infineon Technologies AG, Neubiberg (DE)

(72) Inventor: Robert J. Pizzuti, Rochester Hills, MI (US)

(73) Assignee: Infineon Technologies AG, Neubiberg (DE)

( * ) Notice: Subject to any disclaimer, the term of this patent is extended or adjusted under 35 U.S.C. 154(b) by 449 days.

(21) Appl. No.: 14/987,563

(22) Filed: Jan. 4, 2016

(65) Prior Publication Data

US 2017/0192060 A1 Jul. 6, 2017

(51) Int. Cl.
*G01R 31/327* (2006.01)
*G01R 15/14* (2006.01)
(Continued)

(52) U.S. Cl.
CPC ......... *G01R 31/327* (2013.01); *G01R 15/146* (2013.01); *G01R 15/18* (2013.01);
(Continued)

(58) Field of Classification Search
CPC ........ G01R 19/00; G01R 19/10; G01R 15/20; G01R 15/146; G01R 15/18; G01R 31/007;
(Continued)

(56) References Cited

U.S. PATENT DOCUMENTS

| 4,771,357 A | 9/1988 | Lorincz et al. |
| 6,489,693 B1 | 12/2002 | Hetzler |

(Continued)

FOREIGN PATENT DOCUMENTS

| CN | 103207303 A | 7/2013 |
| CN | 103207339 A | 7/2013 |

(Continued)

OTHER PUBLICATIONS

Office Action, in the German language, from counterpart German Application No. 102016125575.0, dated Apr. 9, 2018, 8 pp.

(Continued)

*Primary Examiner* — Thienvu V Tran
*Assistant Examiner* — Nicolas Bellido
(74) *Attorney, Agent, or Firm* — Shumaker & Sieffert, P.A.

(57) ABSTRACT

Systems, devices, methods, and techniques are disclosed for performing calibrated measurements of current through switches in an electronic control unit. In one example, a device includes a current sensor system; a controller, operably connected to the current sensor system; and one or more switches, operably connected to the controller. The current sensor system is configured to receive a measurement of current conducted through at least one switch of the one or more switches. The current sensor system is further configured to perform a measurement of calibrated total current for the one or more switches. The current sensor system is further configured to determine a calibrated value of current for the at least one switch, based at least in part on a comparison of the measurement of current conducted through the at least one switch and the measurement of calibrated total current for the one or more switches.

16 Claims, 7 Drawing Sheets

(51) Int. Cl.

| | |
|---|---|
| *H02H 3/32* | (2006.01) |
| *G01R 15/20* | (2006.01) |
| *H02H 3/04* | (2006.01) |
| *G01R 15/18* | (2006.01) |
| *G01R 19/165* | (2006.01) |
| *G01R 31/00* | (2006.01) |
| *H02H 3/00* | (2006.01) |
| *H02H 7/26* | (2006.01) |
| *H02H 3/08* | (2006.01) |

(52) U.S. Cl.
CPC ....... *G01R 15/20* (2013.01); *G01R 19/16571* (2013.01); *G01R 31/007* (2013.01); *H02H 3/006* (2013.01); *H02H 3/042* (2013.01); *H02H 3/32* (2013.01); *H02H 7/267* (2013.01); *G01R 31/3277* (2013.01); *H02H 3/08* (2013.01)

(58) Field of Classification Search
CPC ............. G01R 31/327; G01R 31/3277; G01R 19/16571; H03K 17/08; H02H 3/042; H02H 3/32; H02H 3/006; H02H 3/08; H02H 7/267; H02M 3/156; H02M 1/00; H02J 7/00; H02J 7/0052; H02J 2007/0059; H02J 1/14; H02J 3/12; H02J 3/14; B60L 1/00; B60R 16/03; B60R 21/02; Y04S 20/222; Y10T 307/46; Y10T 307/461
USPC ............................ 307/9.1, 10.1, 38; 361/87
See application file for complete search history.

(56) References Cited

U.S. PATENT DOCUMENTS

| | | | |
|---|---|---|---|
| 8,854,065 | B2 | 10/2014 | Mauder et al. |
| 9,103,888 | B2 | 8/2015 | Pang |
| 2003/0080772 | A1* | 5/2003 | Giacomini .......... B60R 16/0239 324/765.01 |
| 2009/0072809 | A1* | 3/2009 | Kaltenegger ........ G01R 31/024 324/76.11 |
| 2010/0208403 | A1 | 8/2010 | Das et al. |
| 2011/0316509 | A1 | 12/2011 | Chen |
| 2014/0078629 | A1* | 3/2014 | Cortigiani .......... H03K 17/0822 361/79 |
| 2015/0097544 | A1* | 4/2015 | Bizjak .................. H02M 3/156 323/284 |
| 2015/0197153 | A1* | 7/2015 | Luedtke ................ B60L 3/0023 324/503 |

FOREIGN PATENT DOCUMENTS

| | | |
|---|---|---|
| CN | 103684370 A | 3/2014 |
| CN | 103795381 A | 5/2014 |
| CN | 104518668 A | 4/2015 |
| CN | 104786859 A | 7/2015 |
| DE | 19906276 A1 | 9/2000 |
| DE | 10057486 A1 | 4/2001 |
| DE | 10154763 A1 | 5/2003 |
| WO | 2014035387 A1 | 3/2014 |

OTHER PUBLICATIONS

Office Action, in the Chinese language, from counterpart Chinese Application No. 201611201104.4, dated Feb. 27, 2019, 11 pp.

* cited by examiner

ENHANCED PROTECTION, DIAGNOSIS, AND CONTROL OF POWER DISTRIBUTION AND CONTROL UNITS

TECHNICAL FIELD

This disclosure relates to power systems, and in particular, to electronic control units.

BACKGROUND

Smart switches with current sensors are often used to drive loads, such as lights in automotive systems. Smart switch current sensing may use a feedback pin to provide a current proportional to the output current of a switch. The current sensing apparatus may be configured to sense a current within a range similar to a nominal current that the switch is intended to conduct.

SUMMARY

In general, various examples of this disclosure are directed to an electronic control unit configured to provide enhanced accuracy current sensing over a wide range of current levels. In various examples of this disclosure, an electronic control unit may include a current sensor system that may perform a calibrated measurement of the current draw through the switches for each load component connected to the electronic control unit or loads connected to a specific power feed, with an accurate measurement of current across a large range of current, which may not have been possible with traditional individual switch current sensing alone. Thus, a single model of electronic control unit of this disclosure may be applicable to a wide range of different applications across a wide range of currents. The electronic control unit may communicate the calibrated current draw of each switch to each load component to the controller of the electronic control module. The controller may regulate the current to the switches, including switches without current sensing such as relays or metal-oxide-semiconductor field-effect transistors (MOSFETs) based at least in part on the calibrated current values determined by or calculated based on the current sensor system. The electronic control unit may potentially perform the determination of the calibrated current value per switch repeatedly over time, such as each time the electronic control unit powers on, which may help ensure that the calibrated current value stays accurately calibrated over time. The controller may thus regulate the power consumed in the loads connected to each switch and the power dissipated in the switch accurately. The electronic control unit may also be enabled to quickly detect a fault condition in the load or an issue with another component and quickly shut off current to the load or component that has failed or malfunctioned or for which the load circuit connection or load wiring connection has failed or malfunctioned.

One example is directed to a device. The device includes a current sensor system; a controller, operably connected to the current sensor system; and one or more switches, operably connected to the controller. The current sensor system is configured to receive a measurement of current conducted through at least one switch of the one or more switches. The current sensor system is further configured to perform a measurement of calibrated total current for the one or more switches. The current sensor system is further configured to determine a calibrated value of current for the at least one switch, based at least in part on a comparison of the measurement of current conducted through the at least one switch and the measurement of calibrated total current for the one or more switches.

Another example is directed to a system. The system includes a data receiver configured to receive a measurement of current conducted through at least one switch of one or more switches operably connected to the system. The system further includes a current sensor configured to perform a measurement of calibrated total current for the one or more switches. The system further includes a comparator system configured to perform a comparison of the measurement of current conducted through the at least one switch and the measurement of calibrated total current for the one or more switches, and thereby to generate a calibrated value of current for the at least one switch. The system further includes a data interface system configured to generate an output indicating the calibrated value of current for the at least one switch.

Another example is directed to a method. The method includes receiving a measurement of current conducted through at least one switch of one or more switches. The method further includes performing a measurement of calibrated total current for the one or more switches. The method further includes determining a calibrated value of current for the at least one switch, based at least in part on a comparison of the measurement of current conducted through the at least one switch and the measurement of calibrated total current for the one or more switches.

The details of one or more examples of this disclosure are set forth in the accompanying drawings and the description below. Other features, objects, and advantages will be apparent from the description and drawings, and from the claims.

DETAILED DESCRIPTION

Figure 1:
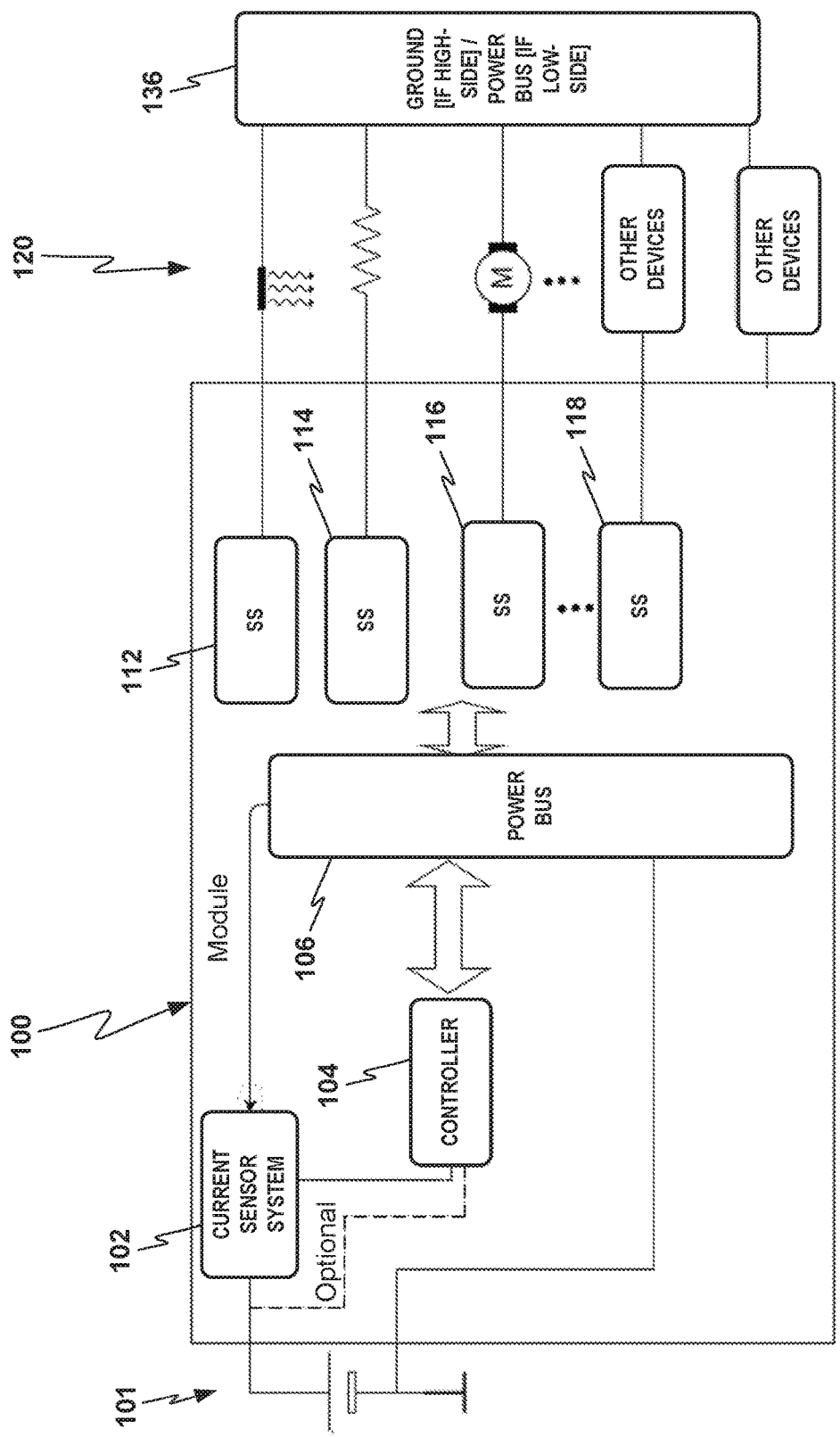
FIG. 1 is a block diagram illustrating an example electronic control module, in an implementation of this disclosure.

FIG. 1 is a block diagram illustrating an example electronic control module 100, in an implementation of this disclosure. Electronic control module 100 may be implemented as a power distribution module (PDM), a body control module (BCM), or a powertrain control module (PCM), or other module for controlling current supplied to components of an automobile, for example. Electronic control module 100 includes a current sensor system 102, a controller 104 (e.g., a microcontroller, a system controller) operably connected to current sensor system 102, a power bus 106 operably connected to controller 104, and representative example switches 112, 114, 116, and 118 operably connected to power bus 106. Current sensor system 102 and power bus 106 may be operably connected to a power supply 101. Controller 104 may be connected to power via current sensor system 102 and power bus 106 in some examples, or may also be independently connected to power supply 101 in some examples.

Switches 112, 114, 116, and 118 each switch power for a respective electronic load component 120, such as headlights, other exterior lights, interior lights, electrical motors (e.g., for windows or locks), heating coils, and/or other electrical devices and components in an automobile, for example. The headlights and other lights may be light-emitting diode (LED) lights and/or incandescent lights, in various applications. The electronic load components 120 may be connected to ground or power bus 136, which may be ground in implementations using high-side current sensors, or a power bus in implementations using low-side current sensors. Switches 112, 114, 116, and 118 may incorporate features such as built-in diagnosis and protection, in some examples. Other implementations may include other types of switches, as further described below. The various electrical devices and components may also be connected to ground/power bus 136.

As noted above, electronic control module 100 may include a current sensor system 102 that may perform a calibrated measurement of the current draw through each of one or more switches 112, 114, 116, and 118 connecting each of one or more load components connected to the electronic control module 100. Current sensor system 102 may perform its calibrated current measurements of the current through one or more of switches 112, 114, 116, and 118 repeatedly over time, such as soon after each time electronic control module 100 powers on, with an accurate measurement of current across a large range of current. Current sensor system 102 may communicate the calibrated current draw for each switch among switches 112, 114, 116, and 118 to the controller 104 of the electronic control module 100, potentially repeatedly over time, such as soon after each switch first turns on, in some examples. Current sensor system 102 may also maintain a look-up table of calibrated current draw values and/or calibration factors for each of the switches 112, 114, 116, and 118, and potentially any MOSFETs, relays, or other components powered by controller 104. Controller 104 may thus regulate the power to each component accurately, and be able to quickly cut off power to a component or load that fails, based on outputs from current sensor system 102, including protecting a limited number of switch devices that do not include current sensing.

A traditional smart switch using a feedback pin is typically calibrated a maximum of once during system assembly, and typically has an accuracy that decreases strongly (e.g., exponentially) the further current is reduced below its nominal or rated currency range. For example, a traditional smart switch may be able to sense current to an accuracy of within plus or minus 5 to 10 percent at a nominal current range of 4 to 5 amps (e.g., to power an incandescent light), but at 0.5 amps (e.g., to power a light-emitting diode (LED)), may only be accurate to within plus or minus 50 percent. This presents a limitation to design of systems and protection of loads. Some typical smart switches include a range of nominal currents which support different loads but implementation of these requires different variants which may often be impractical. In contrast, implementations of this disclosure such as electronic control module 100 may measure calibrated current values for each switch repeatedly, such as after each power-on or each switch activation, and may be accurate at any current from a wide current range covering a broad array of applications, and so able to power a diverse range of load components, such as either an incandescent light or an LED, with similar accuracy. Because implementations of this disclosure such as electronic control module 100 may enable current through each switch to be detected and calibrated via a single current sensor system 102, implementations of this disclosure may also eliminate the need for dedicated current sensing in each switch, in some examples. This may eliminate the need for calibration of the switch at time of assembly of the system. This system may allow for increased diagnosis or identification of specific load conditions which may not be possible using existing smart switches' current feedback alone.

Current sensor system 102 may in various examples be implemented as a Hall effect sensor that measures current by its magnetic field. Current sensor system 102 may also in various examples be implemented as a giant magnetoresistive (GMR) current sensor, a resistive shunt current sensor, a current sensing current transformer or inductive sensor, or any other type of current sensor. Aspects of electronic control module 100 are further described with reference to various examples below.

Figure 2:
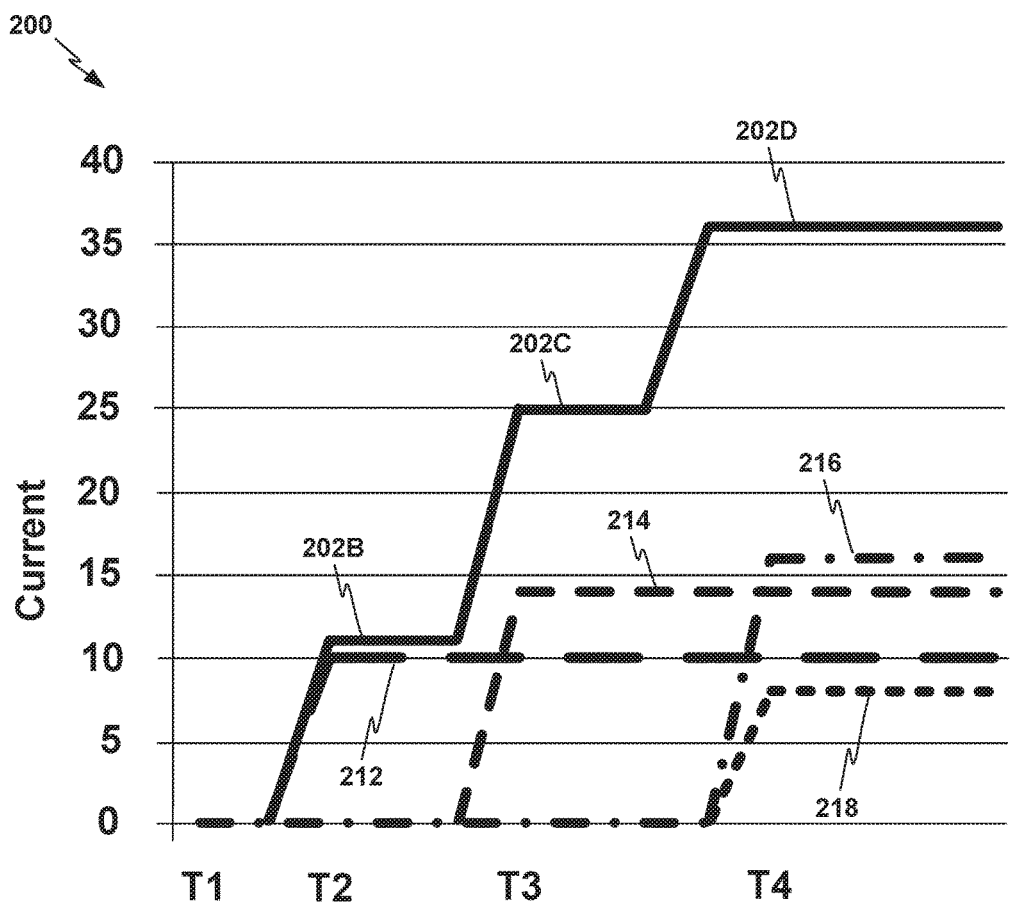
FIG. 2 shows an example chart of current over time as detected by a plurality of switches and by a current sensor system comprised in the electronic control module of FIG. 1, in an implementation of this disclosure.

FIG. 2 shows an example chart 200 of current over time as detected by a plurality of switches 112, 114, 116, and 118 and by a current sensor system 102 comprised in electronic control module 100 of FIG. 1, in an implementation of this disclosure. Current sensor system 102 detects calibrated total current going through power bus 106 collectively to switches 112, 114, 116, and 118, independently of the current sensing of switches 112, 114, 116, and 118. Current sensor system 102 may thus enable independent, ongoing calibrated determinations of the current draw of each of the load components serviced via respective switches 112, 114, 116, and 118, as further described below.

Chart 200 shows an initial time T1 before electronic control module 100 is powered on. Chart 200 then shows a time T2 after which switch 112 has turned on. In this illustrative example, switch 112 may detect a current through it of 10 amps (212), and reports this value to current sensor system 102 and/or controller 104. Meanwhile, current sensor system 102 detects a current of 12 amps at time T2 (202B) right after switch 112 has turned on and before any other switches powered by controller 104 have turned on. Current sensor system 102 thus determines a calibrated value of 12 amps for the current draw through switch 112. Current sensor system 102 may also thus determine a calibration factor of +2 amps for switch 112, indicating that the value reported by switch 112 should be corrected by +2 amps. Current sensor system 102 may thus infer, by using calibrations and measuring the current through it on regular basis, the current drawn by each load component, and maintain a look-up table of the calibrated current values and/or the calibration factors.

Current sensor system 102 may continue performing calibrated current measurements of each of the loads powered by controller 104 as additional switches turn on. At time T3, after switch 114 has also turned on to conduct current to its load, switch 114 may measure and report a current value (214), while current sensor system 102 may measure a new value of total calibrated current (202C). Current sensor system 102 may subtract the value of the previously measured current drawn through switch 112 from the total current it measures at time T3 to determine the calibrated current draw of switch 114, as an independent measure of the current through switch 114. Current sensor system 102 may determine a calibration factor for switch 114 as the difference between its calibrated measurement of the current through switch 114 and the value of current as measured and reported by switch 114.

Analogously, at time T4, switches 116 and 118 may both have just turned on, and may each measure and report their own values of current flow (216, 218), while current sensor system 102 may also measure a new value of total current (202D) with the added currents through switches 116 and 118 in addition to the existing currents flowing through switches 112 and 114. Since two switches turned on at substantially or effectively the same time, current sensor system 102 may not yet be able to determine individual calibrated values for the current through each of switches 116 and 118, but instead may determine a combined calibrated value of the net current through the combination of the two switches 116 and 118. Current sensor system 102 may also compare the combined calibrated value of the net current through the combination of the two switches 116 and 118 with the net total of the current values reported by switches 116 and 118 to determine a net total calibration factor, of the difference between its own determined calibrated net total current through the two switches 116 and 118 and the sum of the current values reported by switches 116 and 118. Current sensor system 102 may temporarily store the calibrated combined current value and/or a combined calibration factor of the combination of switches 116 and 118 pending current sensor system 102 being able to identify separate information for the two switches 116, 118 of the combination.

At a subsequent time (not shown in FIG. 2), switch 116 may turn off while switch 118 remains on, and current sensor system 102 may measure a new, lower value of total calibrated current. Current sensor system 102 may then determine the difference in total measured current to be the calibrated current value for switch 116, and the difference between the new total measured current and the total measured current from time T3 before switches 116 and 118 turned on as the calibrated current of switch 118. In another example, current sensor system 102 may equivalently determine the calibrated current of switch 118 as the difference between the temporary combined current of switches 116 and 118 and the drop in current after switch 116 turns off. Current sensor system 102 may also then determine the respective calibration factors of switches 116 and 118 as the respective differences between the respective current values reported by switches 116 and 118 and the newly determined individual calibrated current values of switches 116 and 118. Current sensor system 102 may report its determined calibrated current values for the switches to controller 104. Current sensor system 102 may also store the calibrated current values and/or the calibration factors for switches 116 and 118 in its look-up table, the contents of which current sensor system 102 may also report to controller 104.

Figure 3:
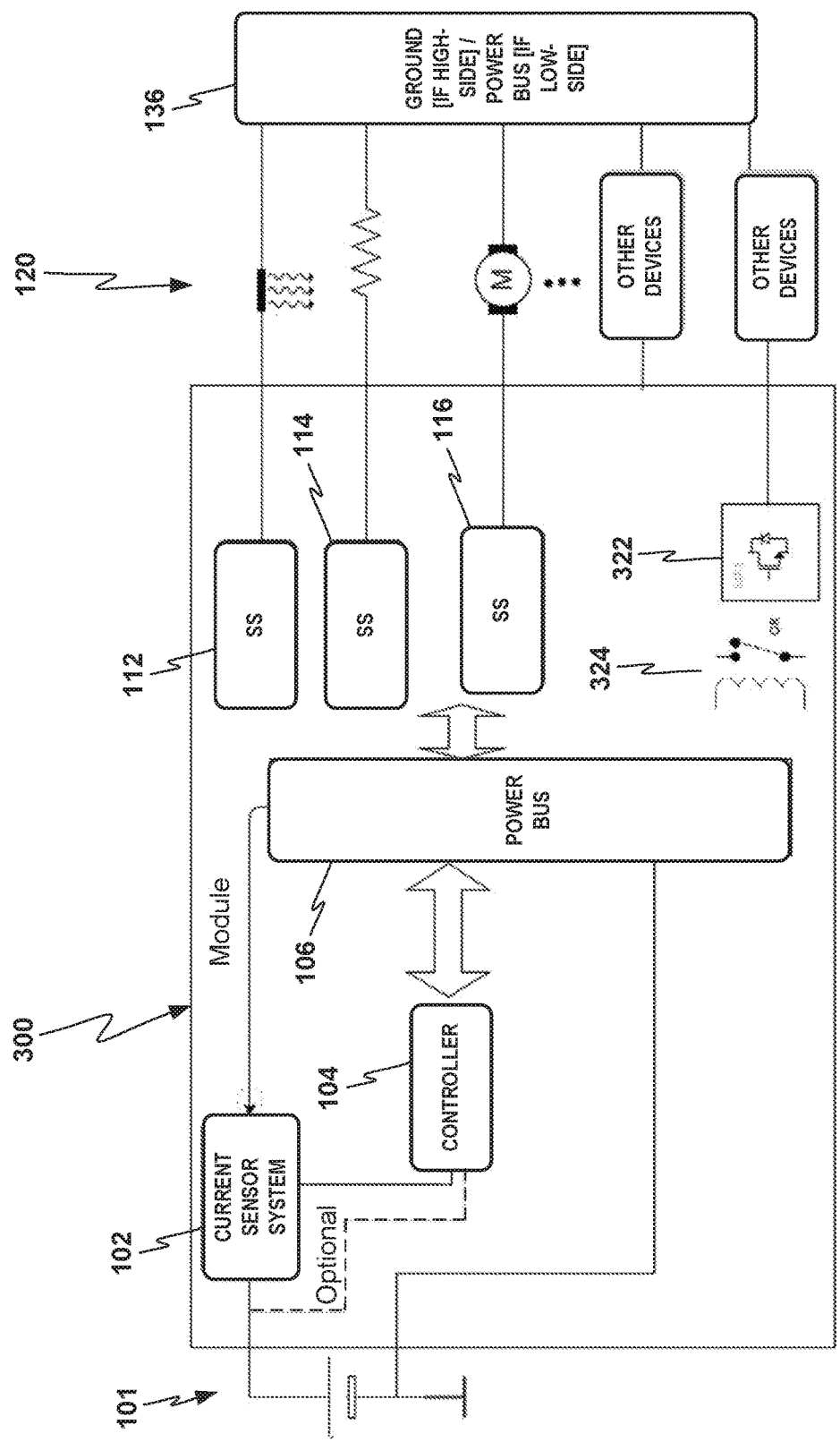
FIG. 3 is a conceptual block diagram illustrating another example electronic control module that includes a MOSFET and/or a relay in addition to a plurality of protected switches in another implementation of this disclosure.

FIG. 3 is a conceptual block diagram illustrating another example electronic control module 300 analogous to electronic control module 100 as described above and that also includes a MOSFET 322 and/or a relay 324 in addition to a plurality of protected switches 112, 114, 116, in another implementation of this disclosure. Electronic control module 300 also includes a current sensor system 102, a controller 104 operably connected to current sensor system 102, a power bus 106 operably connected to controller 104, and power supply 101 connected to the various components listed above, analogously to the description above with reference to FIG. 1.

After electronic control module 300 powers on, current sensor system 102 may measure the total current as each of switches 112, 114, 116 and/or MOSFET 322 and/or 324 switches on or comes on line, in comparison with reported values as detected and reported by the individual components of switches 112, 114, 116 and/or MOSFET 322 and/or relay 324. Current sensor system 102 of electronic control module 300 may thereby measure and record a calibrated value and/or a calibration factor for the current flowing through each of switches 112, 114, 116 and/or MOSFET 322 and/or relay 324 (collectively "switches"), after the respective switches have turned on, in this example.

In particular, in an example with MOSFET 322, switches 112 and 114 may first turn on, and current sensor system 102 may record a calibrated current and/or a calibration factor for each of switches 112 and 114. Then, MOSFET 322 may turn on, and current sensor system 102 may determine a new total current including the current through MOSFET 322, determine the difference between the new total current after MOSFET 322 turned on and the previous total calibrated current before MOSFET 322 turned on, and record the difference as the calibrated current drawn by MOSFET 322. This result can then be used to protect the MOSFET or relay and the load driven by the MOSFET from fault conditions. This example is further described below with reference to FIG. 4.

Current sensor system 102 may measure and record the calibrated values and/or calibration factors for switches 112, 114, 116 and/or MOSFET 322 and/or relay 324 one at a time or temporarily in groups if a group of two or more of switches 112, 114, 116 and/or MOSFET 322 and/or relay 324 switch on at the same time, as described above with reference to FIGS. 1 and 2. In some examples in which a group of two or more of switches 112, 114, 116 and/or MOSFET 322 and/or relay 324 switch on at the same time initially, current sensor system 102 may wait to be able to make a distinguishing measurement between the current flows through the individual switches (potentially including MOSFETs and/or relays) of the simultaneously switched-on group. That is, current sensor system 102 may wait for individual switches (potentially including MOSFETs and/or relays) of the group to switch off and/or back on at individual times separate from switching times of other members of the group, and current sensor system 102 may measure the difference in total calibrated current when an individual member of the group switches off and/or back on.

Current sensor system 102 may thus make a distinguishing measurement of the calibrated current and/or calibration factor of individual members of the group when they switch individually on or off. For example, switch 102 and MOSFET 322 may initially switch on at the same time, and current sensor system 102 may initially measure and record the combined calibrated current of switch 102 and MOSFET 322 as a group. MOSFET 322 may at a subsequent time switch off while no other change is made in any switches, at which time current sensor system 102 may measure the new total calibrated current, determine the calibrated current drawn by MOSFET 322 as the difference in total calibrated current values, and determine the calibrated current drawn by switch 122 as the difference between the group current recorded as being drawn by the group of switch 122 and MOSFET 322, minus the newly determined current of MOSFET 322.

While current sensor system 102 may in some examples wait passively for switches that initially had their total current recorded in groups to subsequently switch one at a time for current sensor system 102 to make a distinguishing measurement of individual current, in other examples, current sensor system 102 may intervene to cause switches to stagger their switching times at least just enough for current sensor system 102 to make individual measurements of their calibrated current draw. In some of these examples, current sensor system 102 may ensure that switches, MOSFETs, relays, and/or other load elements stagger their switching times during initial switch-on; in other examples, current sensor system 102 may allow the switches, MOSFETs, relays, and/or other load elements to turn on without interference at first, wait a period of time for individual switching that would allow individual measurements of the current draw, and then if a set period of time passes without individual switching that would allow distinguishing measurements of the current, then current sensor system 102 begins to intervene to stagger switching times between otherwise simultaneous switching of multiple load elements, to be able to measure and record their individual calibrated current values and/or calibration factors.

Current sensor system 102 may ensure that such staggered switching times do not interfere with the normal functions of the switches and the components to which the switches supply current. For example, current sensor system 102 may ensure that two switches are both turning off because the current from both switches is no longer needed, before causing that turning-off process to be staggered at least just enough for current sensor system to make individual measurements of the total calibrated current after the switching time is complete for just one of the switches, before allowing the other switch to turn off as well. In another example, if current sensor system 102 has not yet been able to make distinguished individual determinations of the calibrated current values for two switches after a set period of time, and current sensor system 102 detects that both switches are off, current sensor system 102 may cause one of the switches individually to turn on just long enough for current sensor system 102 to make a distinguishing measurement of the total calibrated current with the one switch on and the other switch off, and thus a determination of the calibrated current values for both switches (assuming current sensor system 102 has previously determined the group calibrated current of the two switches together and stored that group current at least temporarily in its look-up table or a buffer).

Current sensor system 102 may also use its calculated or determined measurements of current values and/or calibration factors for the switches to detect a short circuit or other fault in a load driven by MOSFET 322 or relay 324. The switches in a given electronic control unit may include some protected switches and some non-protected switches, and the non-protected switches may be at least relatively more susceptible to overcurrent failures. For example, current sensor system 102 may detect a sudden spike or rise in the total current, absent any new switch turning on; determine that the spike is due to a fault in a particular switch, e.g., MOSFET 322 or relay 324; and switch off the particular switch. As a particular example, current sensor system 102 may respond to the spike by implementing an algorithm and/or checking a look-up table to determine that the spike indicates an overcurrent failure of MOSFET 322. Detecting and reacting to a spike in current indicating failure of MOSFET 322 is further described below with reference to FIG. 4.

Current sensor system 102 may react to a detected fault of a load of a particular switch, e.g., MOSFET 322 or relay 324, by turning off current to and shutting down the switch to the load with the fault. Current sensor system 102 may thus enable protection against MOSFETs, relays, or other switches with failed or faulty loads, particularly non-protected switches, by turning off those switches in case of a detected load fault, even without dedicated current sensing and protection features built into the MOSFETs, relays, or other switches themselves. This technique for safely reducing or eliminating dedicated current sensing and protection features built into MOSFETs, relays, or other switches may enable reduced weight, bulk, complexity, and expense in the MOSFETs or relays.

Figure 4:
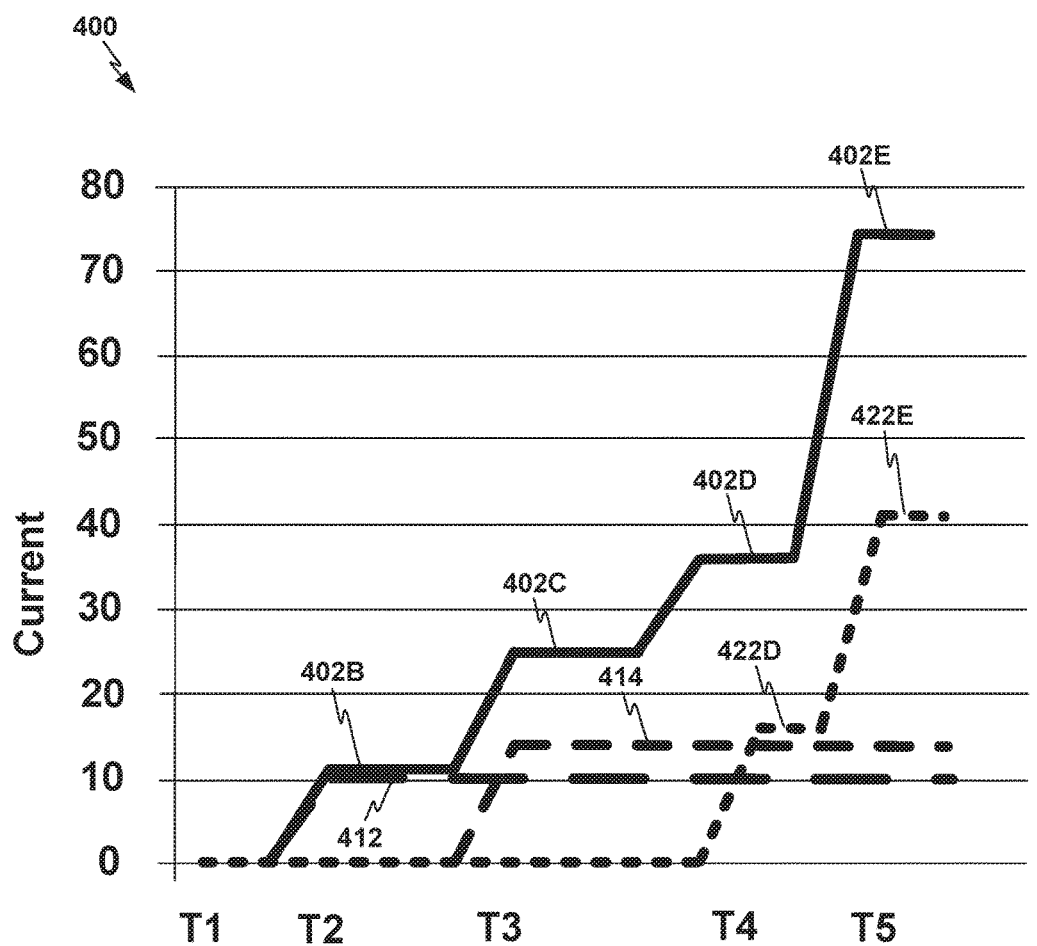
FIG. 4 shows another example chart of current over time through a plurality of protected switches and a MOSFET, as well as through a current sensor system comprised in the electronic control module of FIG. 3, in an implementation of this disclosure.

FIG. 4 shows another example chart 400 of current over time through a plurality of protected switches 112 and 114 and a MOSFET 322, as well as through a current sensor system 102 comprised in electronic control module 300 of FIG. 3, in an implementation of this disclosure. In chart 400, time T1 represents before power is supplied to electronic control module 300. At time T2, a first switch 112 has turned on, and chart 300 shows the current reported by switch 112 (412) as well as the calibrated current detected by current sensor system 102 at time T2 (402B). Current sensor system 102 may detect the difference between the two levels as a calibration factor to apply to current reported by switch 112, in some examples; current sensor system 102 may also record the calibrated current of switch 112, or both the calibration factor and the calibration current of switch 112, in some examples.

At time T3, another switch 114 has turned on and is reporting its current (414), and current sensor system 102 measures the new, higher level of total calibrated current (402C) at the same time T3. Current sensor system 102 may record the difference between its new sensed total calibrated current at time T3 and its previous recorded current at time T2 as the calibrated current for switch 114. Current sensor system 102 may also measure the difference between its calibrated current for switch 114 and the current self-reported by switch 114, and record this difference as a calibration factor for switch 114.

At time T4, a MOSFET 322 as in FIG. 3 has turned on and is reporting its current draw (422D). Current sensor system 102 may, as with the switches, measure the new total calibrated current at time T4 (402D), record the difference between the total calibrated current at time T4 and the total calibrated current at time T3 as the calibrated current of MOSFET 322, and record the difference between the calibrated current of MOSFET 322 and the current draw through MOSFET 322 as self-reported by MOSFET 322 as a calibration factor for MOSFET 322. Current sensor may thus determine the current drawn by MOSFET 322 as the total current that current sensor system 102 measures at time T4 minus the calibrated current values it has recorded for switches 112 and 114, for example.

Then, at time T5, MOSFET 322 may report a spike or significant increase in its current draw (422E), and current sensor system 102 may detect another increase in the total calibrated current it measures (402E), corresponding with an overcurrent fault or short circuit or overload or failure (collectively a "failure" or "overcurrent failure") of MOSFET 322. Current sensor system 102 may measure a significant rise in current without any new switch being turning on. For example, the current through MOSFET 322 may rise from 16 to 40 amps. Current sensor system 102 may detect the total current spiking or rising by 24 amps in the absence of any new load units switching on and by checking the current feedback pins of the other switches may infer that MOSFET 322 has experienced an overcurrent failure.

In response to determining that the load connected through MOSFET 322 has failed, current sensor system 102 may shut off MOSFET 322 (not shown in FIG. 4). In various examples, current sensor system 102 may detect an excess current with no corresponding load unit switching online and shut down the failed or faulty load unit responsible for the failure (e.g., MOSFET 322) before the current has risen by more than a small amount. By quickly shutting down MOSFET 322, current sensor system 102 may protect MOSFET 322 and the load downstream of MOSFET 322 from an excessive current, or at least all but an initial appearance of excessive current, in the event of failure of the load connected via MOSFET 322, and without requiring protection features in MOSFET 322. itself.

The above description with reference to MOSFET 322 and FIGS. 3 and 4 may also apply analogously to a relay 324, or other non-protected switch or failure-susceptible switch, in place of MOSFET 322. Current sensor system 102 may record the calibrated current drawn by relay 324, may detect a failure of relay 324, and may respond to detecting a failure of relay 324 by shutting down relay 324. In other examples, current sensor system 102 may measure and record calibrated current values for multiple MOSFETs, multiple relays, or a combination of one or more MOSFETs and one or more relays, potentially in combination with any number of other types of switches and/or other downstream current-drawing elements.

Current sensor system 102 may record calibrated current values and/or calibration factors for all of such switches and/or other load elements in a look-up table for future reference, and may potentially update the current values and/or calibration factors for any or all of the switches and/or other load elements over time. Current sensor system 102 may respond to any indication of a failure by using an algorithm and/or other internal logic system to identify and shut down a failed switch or other load element, without needing dedicated protection sensing and feedback features in MOSFETs, relays, or other switches or load elements. Current sensor system 102 may thus also provide overcurrent protection for MOSFETs, relays, and other switches or load elements in some operating conditions in which fuses would not be able to switch off current in case of an overcurrent failure.

In examples using more than one MOSFETs and/or relays and/or other overcurrent-susceptible switches, when current sensor system 102 detects a current spike without a corresponding new switch turning on, current sensor system 102 may use an algorithm and/or other logic to determine which of the multiple MOSFETs and/or relays is undergoing the overcurrent failure. For example, current sensor system 102 may cause controller 104 to switch off a selected first MOSFET or relay, and current sensor system 102 may detect the corresponding decline in current, and determine whether the decline in current is consistent with the normal value for the first MOSFET or relay, or is consistent with an abnormally high value for the first MOSFET or relay. Current sensor system 102 may in particular, in some examples, determine if the resulting current after shutting off the first MOSFET or relay is equal to or greater than the total current from all other load units other than the first MOSFET or relay. In these example techniques, current sensor system 102 may detect if the total current it measures after shutting off the first MOSFET or relay indicates that the first MOSFET or relay is the load unit experiencing the failure.

If the first MOSFET or relay is not indicated to be the failed unit, current sensor system 102 may then switch the first MOSFET, relay, or other switch back on and switch off a second MOSFET, relay, or other switch and detect whether that second MOSFET, relay, or other switch is the source of the failure. Current sensor system 102 may proceed in an order through as many of the MOSFETs, relays, or other switches as needed, up to all MOSFETs, relays, and/or other failure-susceptible switches being supplied by electronic control unit 300, until current sensor system 102 identifies and is able to shut off the switch at fault. Current sensor system 102 may be enabled to check through the multiple MOSFETs, relays, and/or other fault-susceptible switches rapidly on the time scale of the overcurrent failure, so that current sensor system 102 may be enabled to shut off the failed switch quickly relative to the failed switch's capacity for its failure to lead to damage in itself or downstream load components, in various examples.

In some examples in which current sensor system 102 attempts to detect which of multiple MOSFETs, relays, and/or other fault-susceptible switches is the cause of a detected overcurrent failure, current sensor system 102 may execute its attempts to detect which load unit has failed in a prescribed order. In some examples, the prescribed order may be a reverse chronological order in which the fault-susceptible switches turned on. In some examples, the prescribed order may be a forward chronological order in which the fault-susceptible switches turned on. In some examples, the prescribed order may be a decreasing order of current value of the normal current drawn by the switches, from the highest current to the lowest; or an increasing value of current from the lowest to the highest. In some examples, current sensor system 102 may have registered one or more of the switches as known to be of a particularly high reliability, and may first test switches not registered as of particularly high reliability. In some examples, current sensor system 102 may record a more detailed order of estimated reliability of all of its connected failure-susceptible switches or switches in general, and may test the switches in order from the bottom of the reliability estimate list, or least reliable, to the top of the reliability estimate list, or most reliable. In some examples, current sensor system 102 may test the switches in an order determined by other logic.

Figure 5:
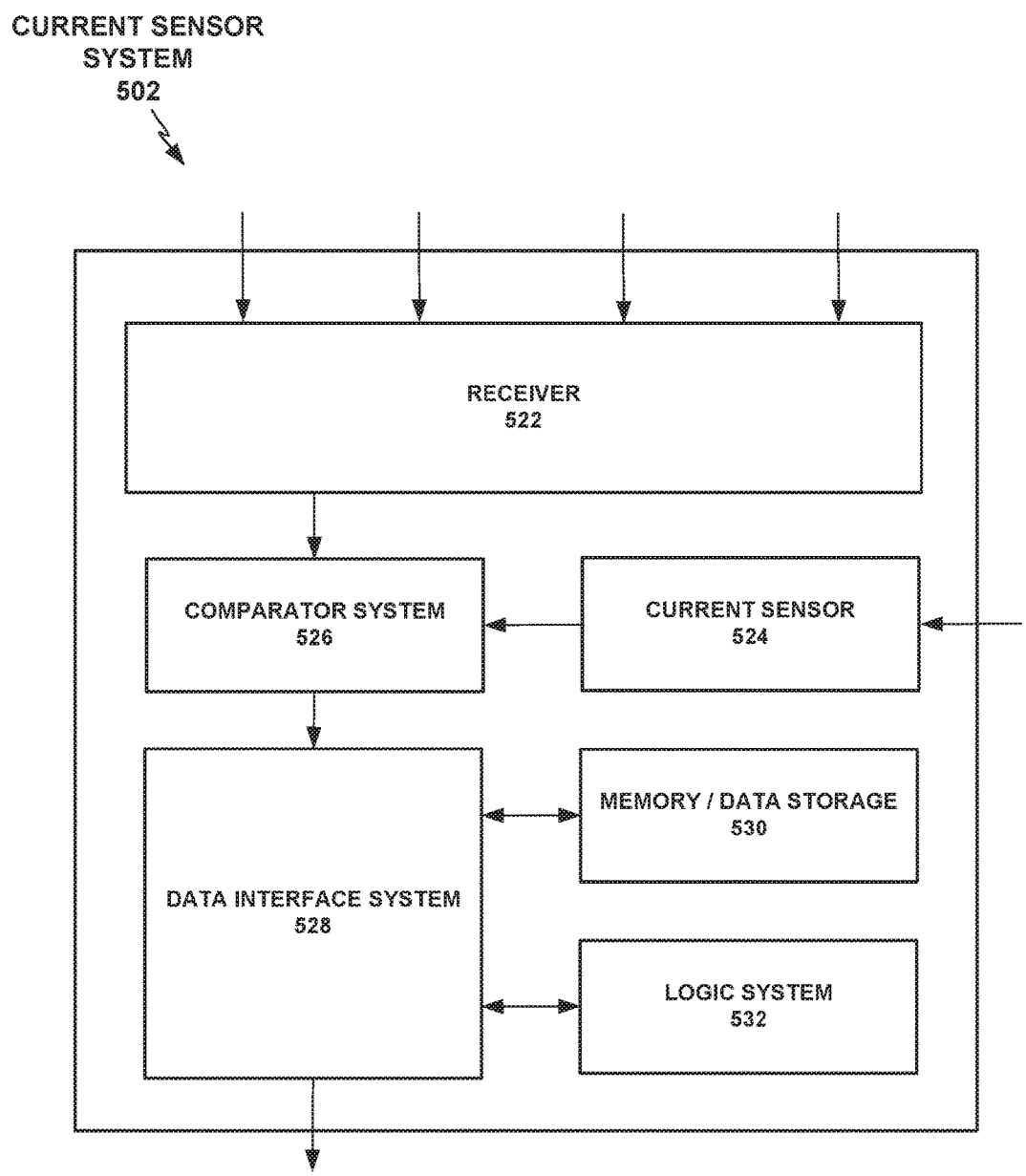
FIG. 5 shows a conceptual block diagram of a current sensor system in one example of this disclosure.

FIG. 5 shows a conceptual block diagram of a current sensor system 502 in one example of this disclosure. Current sensor system 502 is an example implementation of current sensor system 102 that may be included as a component of electronic control units 100 or 300 as described with reference to FIGS. 1-4 and 7. Current sensor system 502 includes a receiver 522, a current sensor 524, a comparator system 526 operably connected to the data receiver 522 and the current sensor 524, one or more memory and/or data storage units 530 ("memory/data storage unit 530"), a data interface system 528 operably connected to the comparator system 526 and the memory/data storage unit 530, and a logic system 532 operably connected to the data interface system 528.

As another feature in some examples, in steady state operation (with no loads being switched on or off), if current sensor system 502 detects an overcurrent condition, the sensor input could set a flag or trip a comparator to trigger the controller to immediately poll the smart switch current feedback signals to determine which switch has experienced a load fault. Thus, the device may be configured to, in response to detecting an overcurrent condition while in steady state operation, poll the measurements of current conducted through the switches to determine which of the switches has experienced a load fault. This feature may improve the response time to a fault condition, reducing the lag and exposure of the switch to overload conditions. This feature may increase system reliability and reduce system cost.

Receiver 522 is configured to receive measurements of current conducted through one or more switches in an electronic control unit, such as protected switches 112, 114, 116, and 118, MOSFET 322, or relay 324 as described above. Receiver 522 is depicted with four example input terminals in FIG. 5, but may be configured with any number of input terminals for receiving measurements of current conducted through any number of switches or other components, in other examples. In other examples, receiver 522 may be configured to determine current in each of one or more input terminals rather than receive externally performed measurements of current through each of one or more switches and/or other components.

Current sensor 524 may be connected to power bus 106 and may be configured to perform the measurement of calibrated total current for some or all of the switches connected to power bus 106. Current sensor 524 may be implemented as a Hall Effect current sensor, a giant magnetoresistive (GMR) current sensor, a transforming inductive current sensor, a resistive shunt current sensor, or other type of current sensor in various examples. In other examples, a current sensor may be exterior to current sensor system 502, and current sensor system 502 may be configured to receive a measurement or indication of the externally determined current.

Comparator system 526 is configured to perform comparisons of the measurement of current conducted through the switches from receiver 522 and the measurement of calibrated total current for the switches from current sensor 524, and thereby to generate the calibrated value of current for each of one or more of the switches. Data interface system 528 is configured to write data to a look-up table loaded and/or stored on memory/data storage unit 530 and to read data from the look-up table, where the data may include the calibrated values of current for one or more of the switches, such as those current values determined at the various times after various switches turn on as described with reference to FIGS. 1-4 and 7, and which may be determined by comparator system 526.

Logic system 532 is configured to determine, in response to an increase in the calibrated total current for the one or more switches in the absence of a switch turning on, which of the one or more switches may be identified with an overcurrent failure. Logic system 532 is further configured to generate an output to the controller (via data interface 528 in this example) to turn off the particular switch identified with the overcurrent failure, as described above. Logic system 532 may in some examples be implemented based at leak in part on one or more processing units that may execute software or firmware with machine-readable code embodying one or more algorithms. Logic system may in some examples be implemented based at least in part on logic hardware such as one or more application specific integrated circuits (ASICs), field-programmable gate arrays (FPGAs), programmable logic devices (PLDs), complex programmable logic devices (CPLDs), systems on chip (SoCs), any other form of logic hardware, and/or any combination of hardware, software, firmware, or other implementations.

Figure 6:
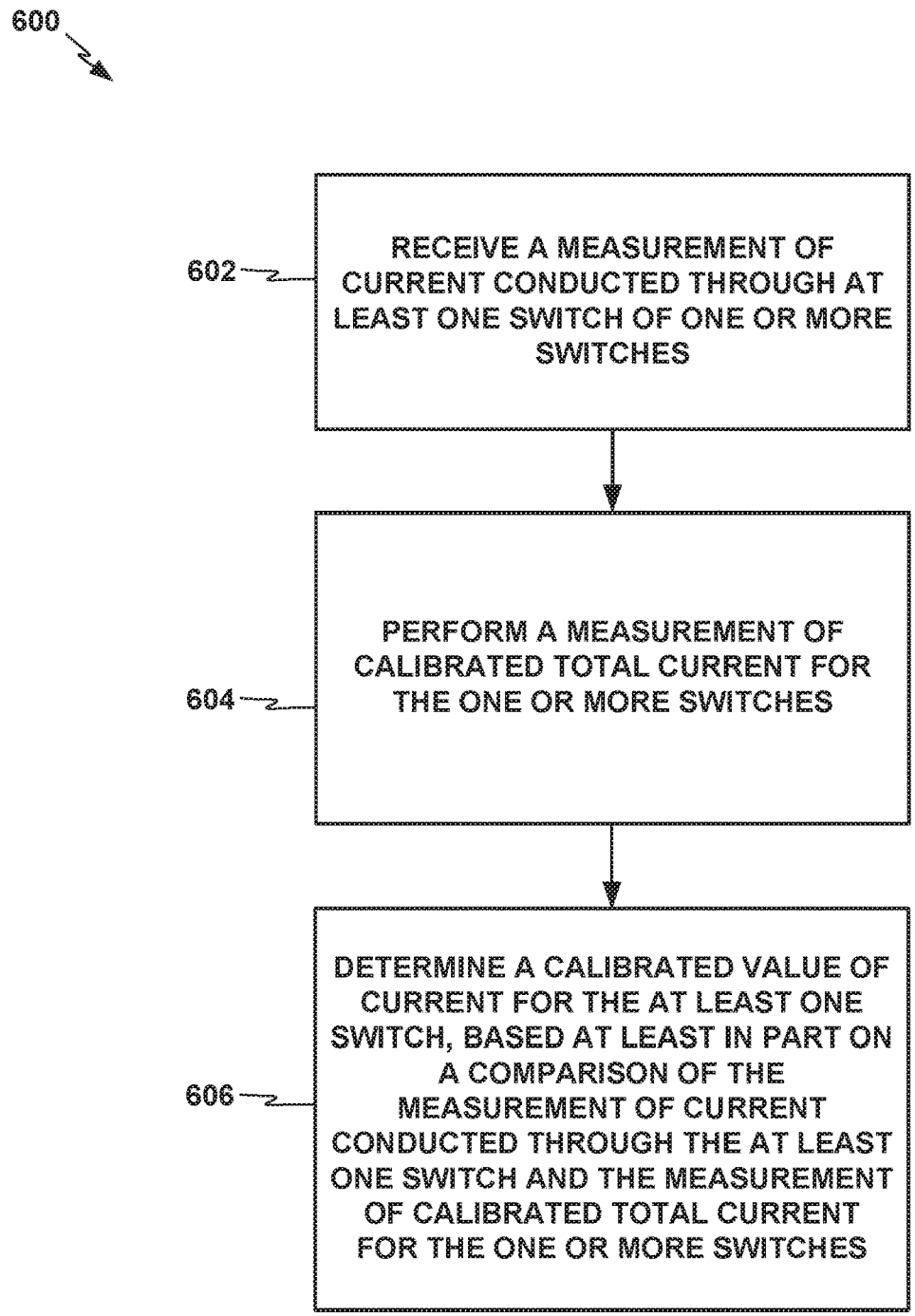
FIG. 6 is a flowchart illustrating a method of operating a current sensor for measuring and storing calibrated values of current draw through a plurality of switches and calibration factors for the switches in an electronic control module, among other advantages, in accordance with an example of this disclosure.

FIG. 6 is a flowchart illustrating a method 600 of operating a current sensor for measuring and storing calibrated values of current draw through a plurality of switches and calibration factors for the switches in an electronic control module, among other advantages, in accordance with an example of this disclosure. Method 600 may be a generalized form of the operation of various current sensor implementations of this disclosure such as electronic control units 100 and 300, processes 200 and 400, and current sensor system 500 as described with reference to FIGS. 1-5 and 7.

In the example of FIG. 6, method 600 includes receiving a measurement of current conducted through at least one switch of one or more switches (e.g., current sensor system 102 or receiver 522 of current sensor system 502 receiving respective measurements of current conducted through each of one or more switches potentially including one or more of switches 112, 114, 116, and 118, MOSFET 322, and relay 324, as described with reference to FIGS. 1-5 and 7) (602). Method 600 further includes performing a measurement of calibrated total current for the one or more switches (e.g., current sensor system 102 or current sensor 524 of current sensor system 502 performing a measurement of calibrated total current being supplied to any one or more switches via power bus 106 as described with reference to FIGS. 1-5 and 7) (604). Method 600 further includes determining a calibrated value of current for the at least one switch, based at least in part on a comparison of the measurement of current conducted through the at least one switch and the measurement of calibrated total current for the one or more switches (e.g., current sensor system 102 or comparator system 526 (and potentially logic system 532) of current sensor system 502 comparing the current measurement for a particular switch with the change in total calibrated current after a switching time for the particular switch, potentially including a comparison or difference with a previously recorded total calibrated current, and potentially including a distinguishing among the current values of multiple switches that initially have an overlapping or simultaneous switching time, as described with reference to FIGS. 1-5 and 7) (606).

Figure 7:
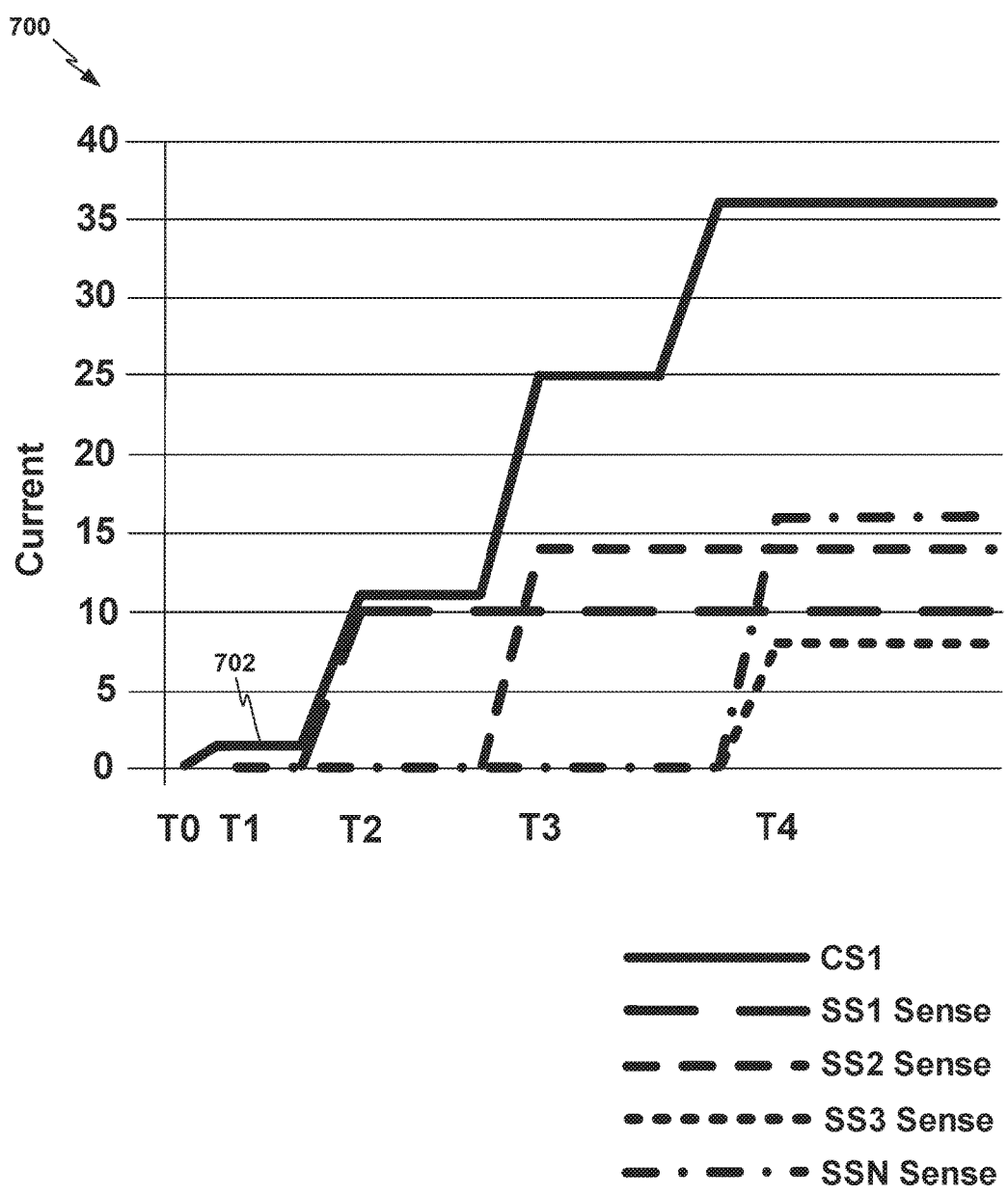
FIG. 7 shows another example chart of current over time through a plurality of switches and by a current sensor system comprised in the electronic control module of FIG. 1, in another implementation of this disclosure in which the current sensor system may detect and provide fault indication on the electronic control module itself.

FIG. 7 shows another example chart 700 of current over time through a plurality of switches 112, 114, 116, and 118 and by a current sensor system 102 comprised in electronic control module 100 of FIG. 1, in another implementation of this disclosure in which the current sensor system may detect and provide fault indication on the electronic control module itself. The operation of electronic control module 100 in the example of FIG. 7 may be similar to the operation during turning on switches as described above, but in the example of FIG. 7, current sensor system 102 may measure the base current load of electronic control module 100 before any of the switches are turned on (assuming the power supply and other components are powered from this pin). Current sensor system 102 may compare this base current against a limit to detect or determine if there is a fault in electronic control module 100 itself (e.g., a resistive short or device failure that creates a higher than normal current but otherwise does not alter functionality) that may cause the operation current of electronic control module 100 to be higher than normal.

The power draw of electronic control module 100 may be substantially lower than for the loads connected through switches 112, 114, 116, and 118, as shown in FIG. 7, and may be on the order of 1 to 3 amps, in some examples. Electronic control module 100 may experience a fault in itself by a dendritic dielectric breakdown in an internal resistor or other internal resistor failure, for example.

Depending on the source of the power feeds, current sensor system 102 may also subtract the initial current 702 that electronic control module 100 draws from the current of the switches, at or soon after time T1 as shown in FIG. 7. Thus, as shown in FIG. 7, at time T0, electronic control module 100 is not yet powered. At time T1, electronic control module 100 is powered with no outputs on, and current sensor system 102 measures the current of electronic control module 100. At time T2, the first switch is turned on. Between times T1 and T2, current sensor system 102 may diagnose the own current draw of electronic control module 100 and report if the current draw is over a threshold.

Any of the circuits, devices, and methods described above may be embodied in or performed in whole or in part by any of various types of integrated circuits, chip sets, and/or other devices, and/or as software executed by a computing device, for example. This may include processes performed by, executed by, or embodied in one or more microcontrollers, central processing units (CPUs), processing cores, field-programmable gate arrays (FPGAs), programmable logic devices (PLDs), complex programmable logic devices (CPLDs), application specific integrated circuits (ASICs), systems on chip (SoCs), virtual devices executed by one or more underlying computing devices, or any other configuration of hardware and/or software.

For example, a current sensor of this disclosure (e.g., current sensors 100, 300) may be implemented or embodied as an integrated circuit configured, via any combination of hardware, logic, general purpose processors, application specific integrated circuits (ASICs), field programmable gate arrays (FPGAs), and/or general processing circuits, which may execute software instructions in some examples, to perform various functions described herein. The integrated circuit may be configured to perform any of the processes as described above. In some examples, a current sensor system and a controller as described above may be combined or integrated and/or share some or all functions in common. Additional aspects of this disclosure are enumerated as follows as aspects A1-A20.

A1. In one aspect A1 of this disclosure, a device comprises a current sensor system; a controller, operably connected to the current sensor system; and one or more switches, operably connected to the controller, wherein the current sensor system is configured to: receive a measurement of current conducted through at least one switch of the one or more switches; perform a measurement of calibrated total current for the one or more switches; and determine a calibrated value of current for the at least one switch, based at least in part on a comparison of the measurement of current conducted through the at least one switch and the measurement of calibrated total current for the one or more switches.

A2. A device of aspect A1, wherein the current sensor system is further configured to communicate the calibrated value of current for the at least one switch to the controller, and the controller is configured to regulate current to the at least one switch based at least in part on the calibrated value of current for the at least one switch as determined by the current sensor system.

A3. A device of aspect A1 or A2, wherein the at least one switch comprises a plurality of switches, such that the current sensor system is configured to receive measurements of current conducted through the plurality of switches, and determine calibrated values of current for the plurality of switches, based at least in part on comparisons of the measurement of current conducted through the plurality of switches and the measurement of calibrated total current for the plurality of switches.

A4. A device of any of aspects A1-A3, wherein the current sensor system is further configured to: determine a calibrated value of current for a particular switch among the one or more switches, based at least in part on a comparison of a measurement of current conducted through the particular switch and the measurement of calibrated total current for the one or more switches; and perform the comparison of the measurement of current conducted through the particular switch and the measurement of calibrated total current for the one or more switches both before and after a respective switching-on time for the particular switch.

A5. A device of any of aspects A1-A4, wherein the current sensor system is further configured to: receive respective measurements of current conducted through each of a plurality of switches among the one or more switches both before and after one or more switching times, wherein at least one of the switches turns on or off at each switching time of the one or more switching times; perform respective measurements of the calibrated total current for the plurality of switches before and after each of the one or more switching times; and record calibrated values of current for each of the plurality of switches, based at least in part on comparisons of the respective measurements of current conducted through the plurality of switches and the measurements of calibrated total current for the plurality of switches before and after the one or more switching times.

A6. A device of any of aspects A1-A5, wherein the current sensor system is further configured to: determine that two switches of the one or more switches turned on at about the same switching time; determine a combined calibrated current for the two switches that turned on at about the same switching time; and determine individual calibrated current values for the two switches based on a comparison of a new calibrated total current after a first of the two switches subsequently turns off while a second of the two switches remains on.

A7. A device of any of aspects A1-A6, wherein the current sensor system measures the base current load of the device before any of the one or more switches are turned on, and detect if there is a fault in the device.

A8. A device of any of aspects A1-A7, wherein the switches comprise one or more protected switches and one or more non-protected switches, and the one or more non-protected switches comprise at least one of one or more metal-oxide semiconductor field effect transistors (MOSFETs) and one or more relays.

A9. A device of any of aspects A1-A8, wherein the current sensor system is further configured to: detect an overcurrent failure in a particular non-protected switch from among the non-protected switches, and generate an output to the controller to turn off the particular non-protected switch for which the overcurrent failure is detected.

A10. A device of any of aspects A1-A9, wherein the current sensor system is further configured such that detecting the overcurrent failure in the particular non-protected switch comprises: measuring a higher value for the calibrated total current for the one or more switches, in the absence of detecting a switch turning on.

A11. A device of any of aspects A1-A10, wherein the current sensor system is further configured such that detecting the overcurrent failure in the particular non-protected switch comprises: for one or more of the switches that are turned on, turning a respective switch off; measuring a new total calibrated current after turning the respective switch off; comparing a decrease in the new total calibrated current after turning the respective switch off with the calibrated value of current for the at least one switch, to determine if the decrease in the new total calibrated current is substantially equal to or significantly greater than the calibrated value of current for the at least one switch; responding to determining that the decrease in the new total calibrated current is substantially equal to the calibrated value of current for the at least one switch by turning the respective switch back on and repeating a switching off and testing process with another respective switch; and responding to determining that the decrease in the new total calibrated current is significantly greater than the calibrated value of current for the at least one switch by keeping the respective switch off and designating the respective switch as identified with an overcurrent failure.

A12. A device of any of aspects A1-A11, wherein the current sensor system comprises: a data receiver configured to receive the measurement of current conducted through the at least one switch of the one or more switches; a current sensor configured to perform the measurement of calibrated total current for the one or more switches; a comparator system configured to perform the comparison of the measurement of current conducted through the at least one switch and the measurement of calibrated total current for the one or more switches, and thereby to generate the calibrated value of current for the at least one switch; and a data interface system configured to write data to a look-up table and to read data from the look-up table, the data comprising the calibrated value of current for the at least one switch.

A13. A device of any of aspects A1-A12, wherein the current sensor system further comprises a logic system configured to: determine, in response to an increase in the calibrated total current for the one or more switches in the absence of a switch turning on, a particular switch of the one or more switches as identified with an overcurrent failure; and generate an output to the controller to turn off the particular switch identified with the overcurrent failure.

A14. A device of any of aspects A1-A13, the device further comprising a bus operably connecting the one or more switches to the controller, wherein the current sensor system is operably connected to the bus, wherein the current sensor system is further configured such that performing the measurement of calibrated total current for the one or more switches is based at least in part on performing a measurement of a current through the bus, and wherein the current sensor system is implemented based on at least one of a Hall Effect current sensor, a giant magnetoresistive (GMR) current sensor, a transforming inductive current sensor, and a resistive shunt current sensor.

A15. A device of any of aspects A1-A14, the device further configured to, in response to detecting an overcurrent condition while in steady state operation, poll the measurements of current conducted through the one or more switches to determine which of the one or more switches has experienced a load fault.

A16. In another aspect A16 of this disclosure, a system comprises: a data receiver configured to receive a measurement of current conducted through at least one switch of one or more switches operably connected to the system; a current sensor configured to perform a measurement of calibrated total current for the one or more switches; a comparator system configured to perform a comparison of the measurement of current conducted through the at least one switch and the measurement of calibrated total current for the one or more switches, and thereby to generate a calibrated value of current for the at least one switch; and a data interface system configured to generate an output indicating the calibrated value of current for the at least one switch.

A17. A system of aspect A16, wherein the data interface system is further configured to write data to a memory or data storage unit, the data interface system thereby being configured to record the calibrated value of current for the at least one switch in a look-up table in the memory or data storage unit, the system further comprising a logic system configured to: determine, in response to an increase in the calibrated total current for the one or more switches in the absence of a switch turning on, a particular switch of the one or more switches as identified with an overcurrent failure; and generate an output to turn off the particular switch identified with the overcurrent failure.

A18. A system of any of aspects A16 or A17, wherein the logic system is further configured such that determining, in response to the increase in the calibrated total current for the one or more switches in the absence of a switch turning on, a particular switch of the one or more switches as identified with an overcurrent failure, comprises the logic circuit being configured to: for one or more of the switches that are turned on, turn a respective switch off; measure a new total calibrated current after turning off the respective switch; compare a decrease in the new total calibrated current after turning the respective switch off with the calibrated value of current for the at least one switch, to determine if the decrease in the new total calibrated current is substantially equal to or significantly greater than the calibrated value of current for the at least one switch; respond to determining that the decrease in the new total calibrated current is substantially equal to the calibrated value of current for the at least one switch by turning the respective switch back on and repeating a switching off and testing process with another respective switch; and respond to determining that the decrease in the new total calibrated current is significantly greater than the calibrated value of current for the at leak one switch by keeping the respective switch off and designating the respective switch as identified with an overcurrent failure.

A19. In another aspect A19 of this disclosure, a method comprises: receiving, by an electronic device, a measurement of current conducted through at least one switch of one or more switches; performing, by an electronic device, a measurement of calibrated total current for the one or more switches; and determining, by an electronic device, a calibrated value of current for the at least one switch, based at least in part on a comparison of the measurement of current conducted through the at least one switch and the measurement of calibrated total current for the one or more switches.

A20. A method as in aspect A19, further comprising: receiving respective measurements of current conducted through each of a plurality of switches among the one or more switches both before and after one or more switching times, wherein at least one of the switches turns on or off at each switching time of the one or more switching times; performing respective measurements of the calibrated total current for the plurality of switches before and after each of the one or more switching times; and recording calibrated values of current for each of the plurality of switches, based at least in part on comparisons of the respective measurements of current conducted through the plurality of switches and the measurements of calibrated total current for the plurality of switches before and after the one or more switching times.

Various examples of the invention have been described. These and other examples are within the scope of the following claims.

What is claimed is:

1. A device for calibration, the device comprising:
a current sensor system;
a controller, operably connected to the current sensor system; and
a plurality of switches, operably connected to the controller, wherein the plurality of switches comprise one or more protected switches and one or more non-protected switches, wherein the one or more non-protected switches comprise at least one of one or more metal-oxide semiconductor field effect transistors or other semiconductor switch and one or more mechanical switches or relays, and wherein the current sensor system is configured to:
receive a measurement of current conducted through at least one switch of the plurality of switches;
perform a measurement of calibrated total current conducted through the plurality of switches;
determine a calibrated value of current for the at least one switch using a calibration factor that is based at least in part on a comparison of the measurement of current conducted through the at least one switch and the measurement of calibrated total current conducted through the plurality of switches;
detect an overcurrent failure in a particular non-protected switch from among the non-protected switches; and
generate an output to the controller to turn off the particular non-protected switch for which the overcurrent failure is detected.

2. The device of claim 1, wherein the current sensor system is further configured to communicate the calibrated value of current for the at least one switch to the controller, and the controller is configured to regulate current to the at least one switch based at least in part on the calibrated value of current for the at least one switch as determined by the current sensor system.

3. The device of claim 1, wherein the current sensor system is configured to receive measurements of current conducted through each switch of the plurality of switches, and determine calibrated values of current for each switch of the plurality of switches using a respective calibration factor that is based at least in part on comparisons of the measurement of current conducted through a respective switch of the plurality of switches and the measurement of calibrated total current conducted through the plurality of switches.

4. A device for calibration, the device comprising: a current sensor system;
a controller, operably connected to the current sensor system; and
one or more switches, operably connected to the controller, wherein the current sensor system is configured to:
receive a measurement of current conducted through at least one switch of the one or more switches;
perform a measurement of calibrated total current conducted through the one or more switches;
determine a calibrated value of current for the at least one switch among the one or more switches using a calibration factor that is based at least in part on a comparison of the measurement of current conducted through the at least one switch and the measurement of calibrated total current conducted through the one or more switches; and
perform the comparison of the measurement of current conducted through the at least one switch and the measurement of calibrated total current conducted through the one or more switches both before and after a respective switching-on time for the at least one switch.

5. The device of claim 4, wherein the current sensor system is further configured to:
receive respective measurements of current conducted through each switch among the one or more switches both before and after one or more switching times, wherein at least one of the one or more switches turns on or off at each switching time of the one or more switching times;
perform respective measurements of the calibrated total current conducted through the one or more switches before and after each of the one or more switching times; and
record calibrated values of current for each of the one or more switches using a respective calibration factor that is based at least in part on comparisons of the respective measurements of current conducted through each switch of the one or more switches and the measurements of calibrated total current conducted through the one or more switches before and after the one or more switching times.

6. The device of claim 5, wherein the current sensor system is further configured to:
determine that two switches of the one or more switches turned on at about the same switching time;
determine a combined calibrated current conducted through the two switches that turned on at about the same switching time; and
determine individual calibrated current values for the two switches based on a comparison of a new calibrated total current conducted through the two switches that turned on at about the same switching time after a first switch of the two switches subsequently turns off while a second switch of the two switches remains on.

7. The device of claim 1, wherein the current sensor system is further configured to:
measure a base current load of the device before any of the one or more switches are turned on, and
detect if there is a fault in the device.

8. The device of claim 1, wherein the current sensor system is further configured such that detecting the overcurrent failure in the particular non-protected switch comprises:
measuring a higher value for the calibrated total current conducted through the plurality of switches, in the absence of detecting a switch turning on.

9. The device of claim 1, wherein the current sensor system is further configured such that detecting the overcurrent failure in the particular non-protected switch comprises:
for one or more of the switches that are turned on, turning a respective switch off;
measuring a new total calibrated current conducted through the plurality of switches after turning the respective switch off;
comparing a decrease in the new total calibrated current conducted through the plurality of switches after turning the respective switch off with the calibrated value of current for the at least one switch, to determine if the decrease in the new total calibrated current is substantially equal to or significantly greater than the calibrated value of current for the at least one switch;

responding to determining that the decrease in the new total calibrated current is substantially equal to the calibrated value of current for the at least one switch by turning the respective switch back on and repeating a switching off and testing process with another respective switch; and responding to determining that the decrease in the new total calibrated current is significantly greater than the calibrated value of current for the at least one switch by keeping the respective switch off and designating the respective switch as identified with an overcurrent failure.

10. The device of claim 1, wherein the current sensor system comprises:
a data receiver configured to receive the measurement of current conducted through the at least one switch;
a current sensor configured to perform the measurement of calibrated total current conducted through the plurality of switches;
a comparator system configured to perform the comparison of the measurement of current conducted through the at least one switch and the measurement of calibrated total current conducted through the plurality of switches, and thereby to generate the calibrated value of current for the at least one switch; and
a data interface system configured to write data to a look-up table and to read data from the look-up table, the data comprising the calibrated value of current for the at least one switch.

11. The device of claim 10, wherein the current sensor system further comprises a logic system configured to:
determine, in response to an increase in the calibrated total current conducted through the plurality of switches in the absence of a switch turning on, a particular switch of plurality of switches as identified with an overcurrent failure; and
generate an output to the controller to turn off the particular switch identified with the overcurrent failure.

12. The device of claim 1, further comprising a bus operably connecting the plurality of switches to the controller, wherein the current sensor system is operably connected to the bus, wherein the current sensor system is further configured such that performing the measurement of calibrated total current conducted through the plurality of switches is based at least in part on performing a measurement of a current through the bus, and wherein the current sensor system is implemented based on at least one of a Hall Effect current sensor, a giant magnetoresistive current sensor, a transforming inductive current sensor, and a resistive shunt current sensor.

13. The device of claim 1, wherein the device is further configured to, in response to detecting an overcurrent condition while in steady state operation, poll the measurements of current conducted through the plurality of switches to determine which of the plurality of switches has experienced a load fault.

14. A system comprising:
a data receiver configured to receive a measurement of current conducted through at least one switch of one or more switches operably connected to the system;
a current sensor configured to perform a measurement of calibrated total current conducted through the one or more switches;
a comparator system configured to perform a comparison of the measurement of current conducted through the at least one switch and the measurement of calibrated total current conducted through the one or more switches to determine a calibration factor, and thereby to generate a calibrated value of current for the at least one switch;
a data interface system configured to:
generate an output indicating the calibrated value of current for the at least one switch; and
write data to a memory or data storage unit, the data interface system thereby being configured to record the calibrated value of current for the at least one switch in a look-up table in the memory or data storage unit; and
a logic system configured to:
determine, in response to an increase in the calibrated total current conducted through the one or more switches in the absence of a switch turning on, a particular switch of the one or more switches as identified with an overcurrent failure; and
generate an output to turn off the particular switch identified with the overcurrent failure.

15. The system of claim 14, wherein the logic system is further configured such that determining, in response to the increase in the calibrated total current conducted through the one or more switches in the absence of a switch turning on, a particular switch of the one or more switches as identified with an overcurrent failure, comprises:
for one or more of the switches that are turned on, turning a respective switch off;
measuring a new total calibrated current conducted through the one or more switches after turning off the respective switch;
comparing a decrease in the new total calibrated current after turning the respective switch off with the calibrated value of current for the at least one switch, to determine if the decrease in the new total calibrated current is substantially equal to or significantly greater than the calibrated value of current for the at least one switch;
responding to determining that the decrease in the new total calibrated current is substantially equal to the calibrated value of current for the at least one switch by turning the respective switch back on and repeating a switching off and testing process with another respective switch; and
responding to determining that the decrease in the new total calibrated current is significantly greater than the calibrated value of current for the at least one switch by keeping the respective switch off and designating the respective switch as identified with an overcurrent failure.

16. A method comprising:
receiving a measurement of current conducted through at least one switch of one or more switches;
performing a measurement of calibrated total current conducted through the one or more switches;
determining a calibrated value of current for the at least one switch using a calibration factor that is based at least in part on a comparison of the measurement of current conducted through the at least one switch and the measurement of calibrated total current conducted through the one or more switches;
receiving respective measurements of current conducted through each switch of the one or more switches both before and after one or more switching times, wherein at least one of the one or more switches turns on or off at each switching time of the one or more switching times;

performing respective measurements of the calibrated total current conducted through the one or more switches before and after each of the one or more switching times; and recording calibrated values of current for each of the one or more switches, based at least in part on comparisons of the respective measurements of current conducted through each of the one or more switches and the measurements of calibrated total current conducted through the one or more switches before and after the one or more switching times.

* * * * *